(12) United States Patent
Motz et al.

(10) Patent No.: US 10,490,060 B2
(45) Date of Patent: Nov. 26, 2019

(54) SENSOR CIRCUIT AND SENSING METHOD

(71) Applicant: Infineon Technologies AG, Neubiberg (DE)

(72) Inventors: Mario Motz, Wernberg (AT); Michael Strasser, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/902,505

(22) Filed: Feb. 22, 2018

(65) Prior Publication Data

US 2018/0247522 A1 Aug. 30, 2018

(30) Foreign Application Priority Data

Feb. 24, 2017 (DE) .......... 10 2017 103 873

(51) Int. Cl.
| | |
|---|---|
| H03M 1/00 | (2006.01) |
| G08C 15/02 | (2006.01) |
| G01R 31/3167 | (2006.01) |
| G01R 33/00 | (2006.01) |
| H03M 1/10 | (2006.01) |
| H03M 1/12 | (2006.01) |

(52) U.S. Cl.
CPC ......... *G08C 15/02* (2013.01); *G01R 31/3167* (2013.01); *G01R 33/0023* (2013.01); *H03M 1/1071* (2013.01); *H03M 1/1205* (2013.01); *H03M 1/00* (2013.01); *H03M 1/005* (2013.01); *H03M 1/12* (2013.01); *H03M 1/1225* (2013.01)

(58) Field of Classification Search
CPC .................. H03M 1/00; H03M 1/12
USPC .......... 341/141, 155, 157, 161, 122
See application file for complete search history.

(56) References Cited

U.S. PATENT DOCUMENTS

| | | | | |
|---|---|---|---|---|
| 9,654,128 | B2* | 5/2017 | Pagnanelli | .......... H03M 1/0626 |
| 9,874,609 | B2* | 1/2018 | Rasbornig | .......... G01R 31/3187 |
| 2008/0001806 | A1* | 1/2008 | Uchino | .............. H03M 1/0624 |
| | | | | 341/161 |
| 2012/0206282 | A1 | 8/2012 | Gorbold | |

FOREIGN PATENT DOCUMENTS

DE  69736944 T2  6/2007

OTHER PUBLICATIONS

German Patent Office, Office Action issued for DE 102017103873.6, 10 pgs., dated Aug. 17, 2017.

* cited by examiner

*Primary Examiner* — Joseph J Lauture
(74) *Attorney, Agent, or Firm* — Schiff Hardin LLP

(57) ABSTRACT

The present disclosure relates to a sensor circuit having a first interface configured to receive a first sensor signal in response to a first measurement of a first physical quantity, a first analog-to-digital converter configured to sample the first sensor signal to generate a sampled first sensor signal, a second interface configured to receive a second sensor signal in response to a second measurement of the same first physical quantity, a third interface configured to receive at least one third sensor signal in response to at least one third measurement of at least one second physical quantity that is different from the first physical quantity, a multiplexer configured to multiplex the second and the at least one third sensor signal to a multiplexed sensor signal, and a second analog-to-digital converter coupled to the multiplexer and configured to sample the multiplexed sensor signal to generate a sampled multiplexed sensor signal.

21 Claims, 11 Drawing Sheets

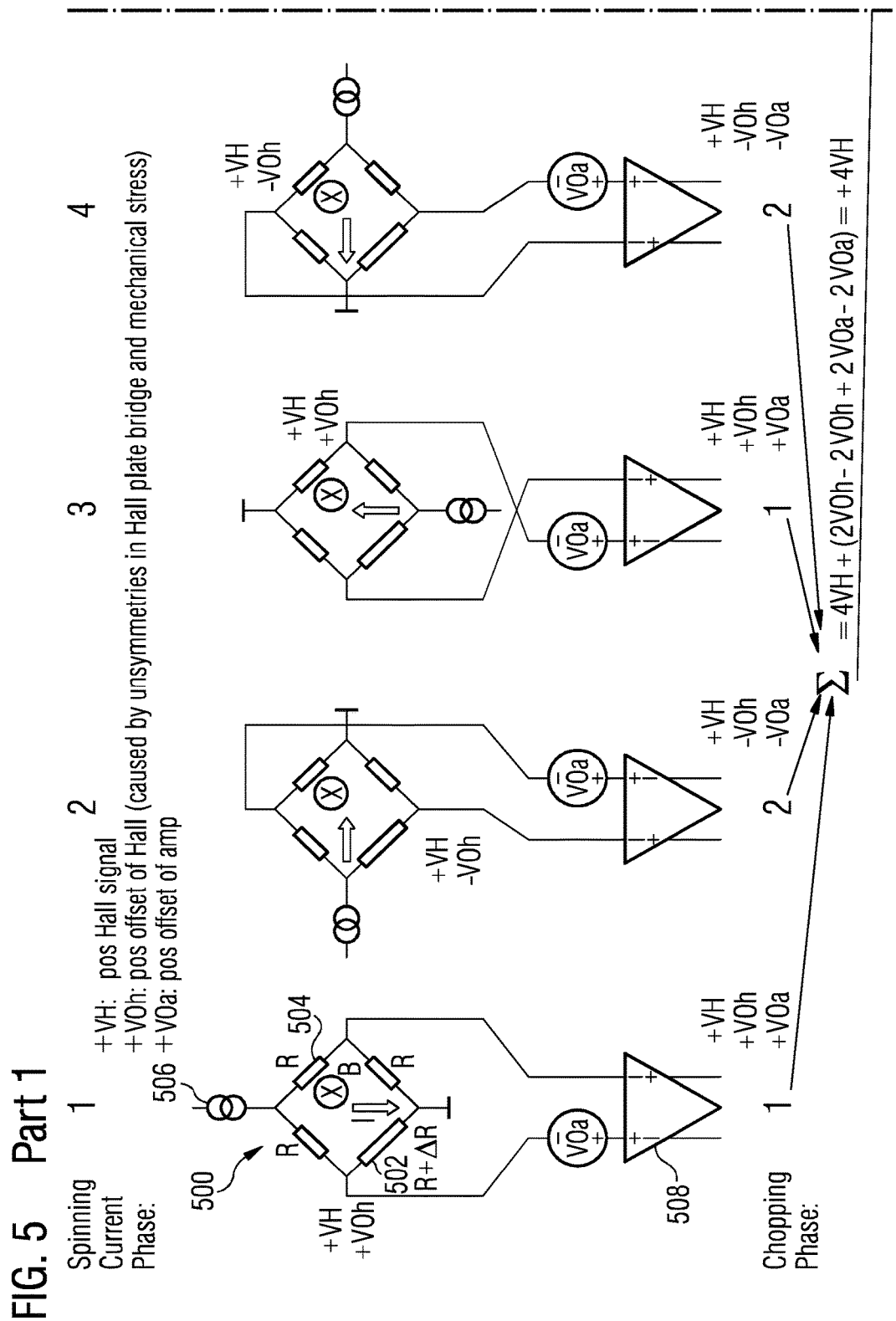

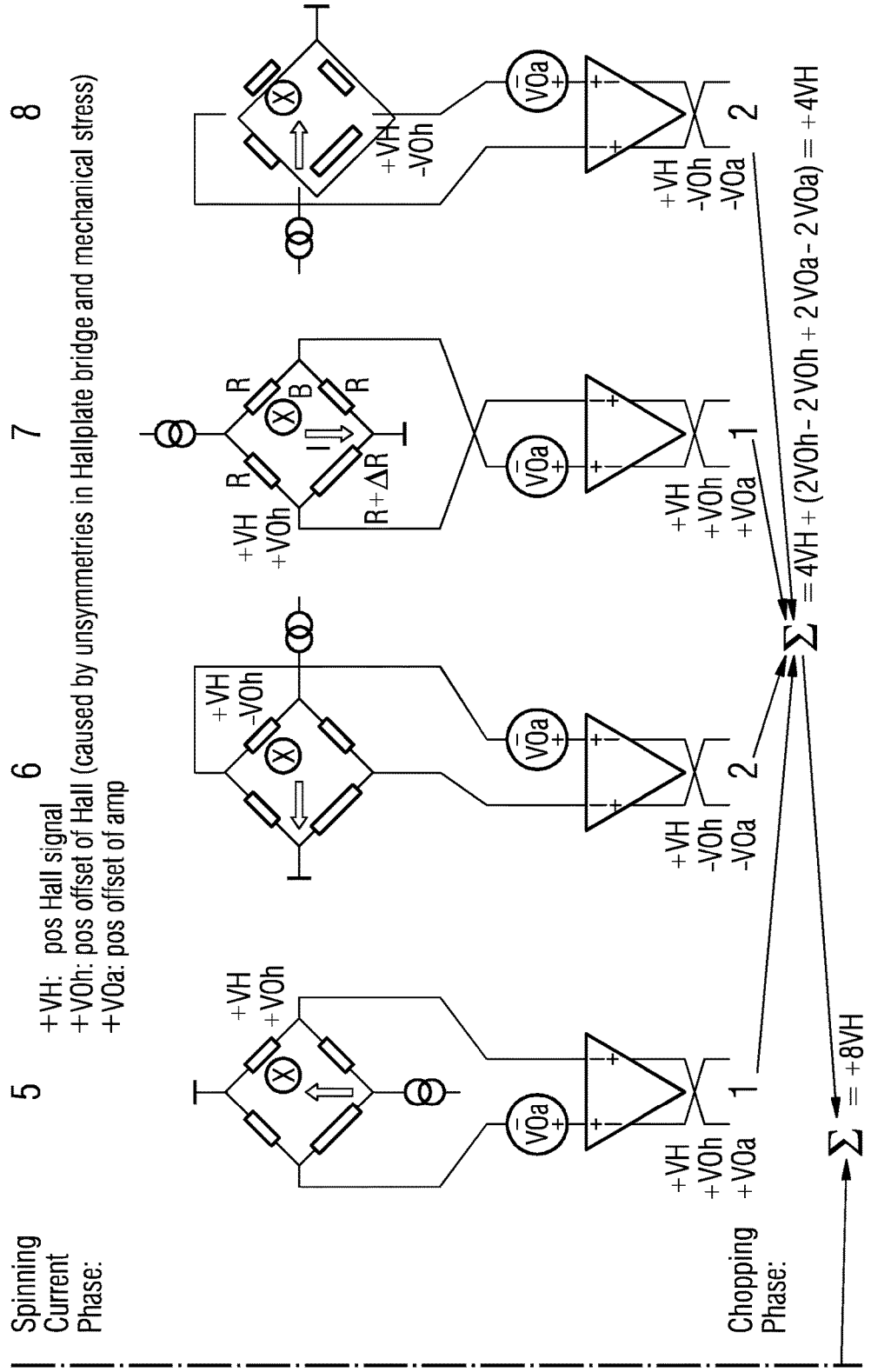
FIG. 5 Part 2

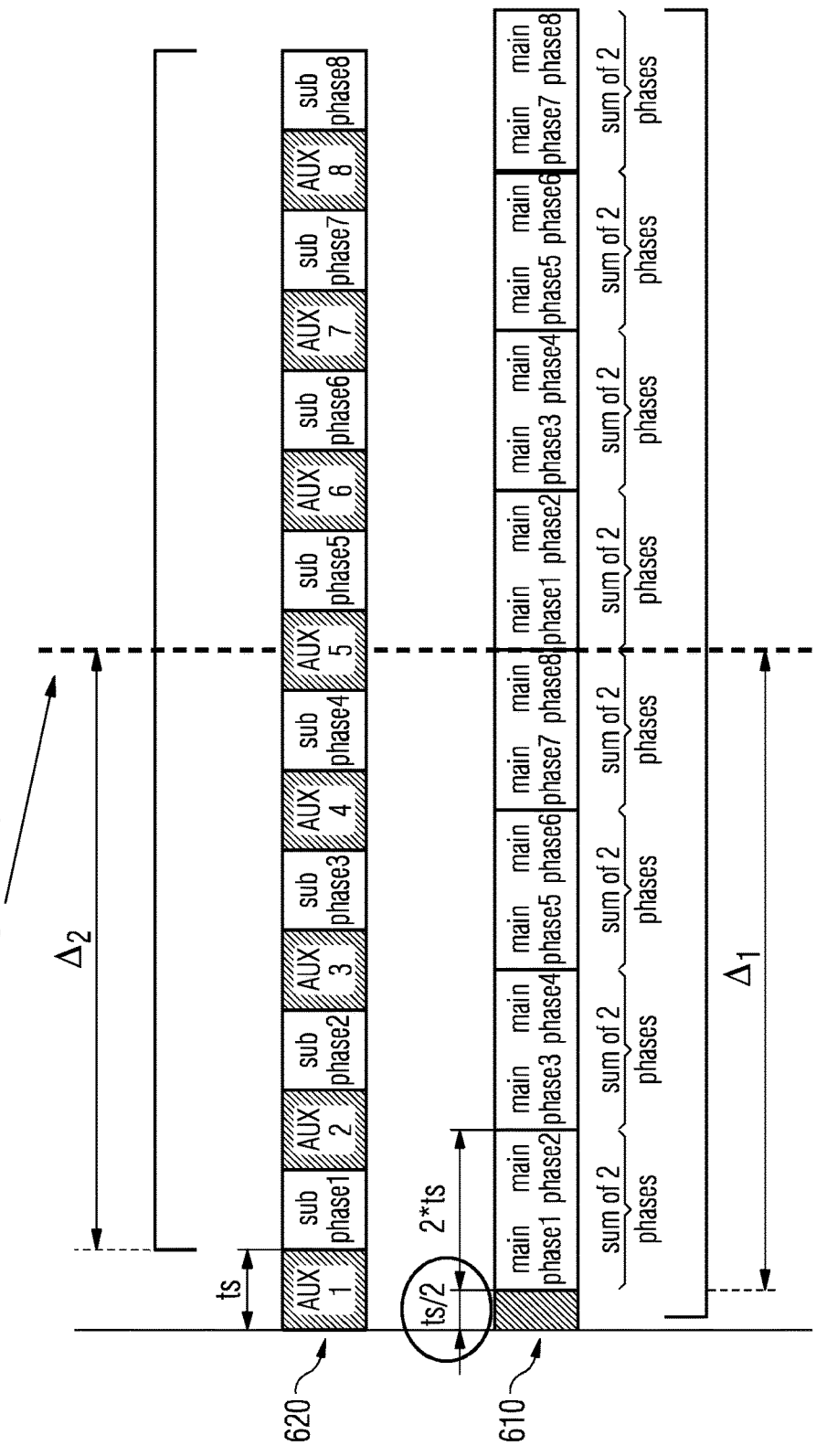

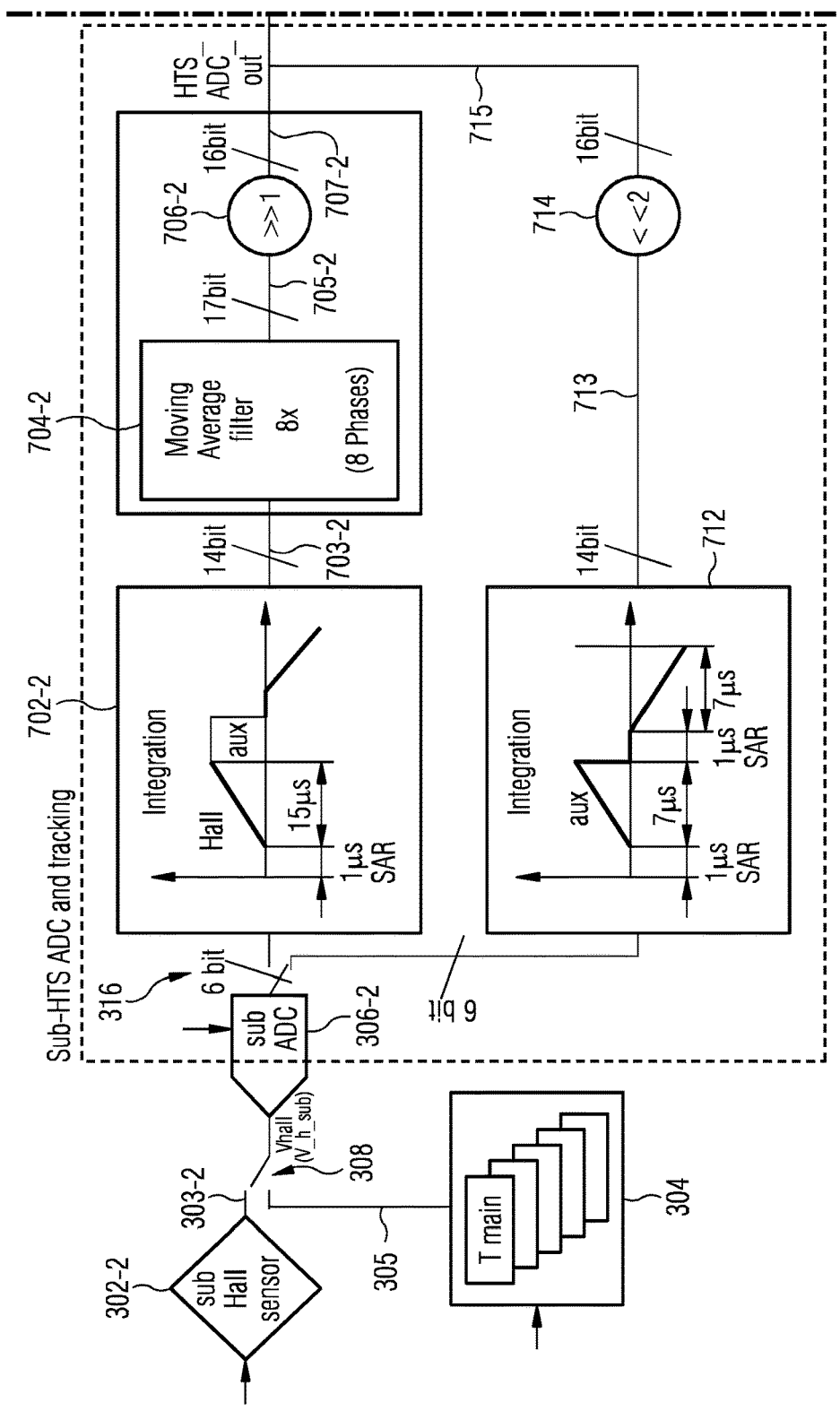
FIG. 7b Part 1

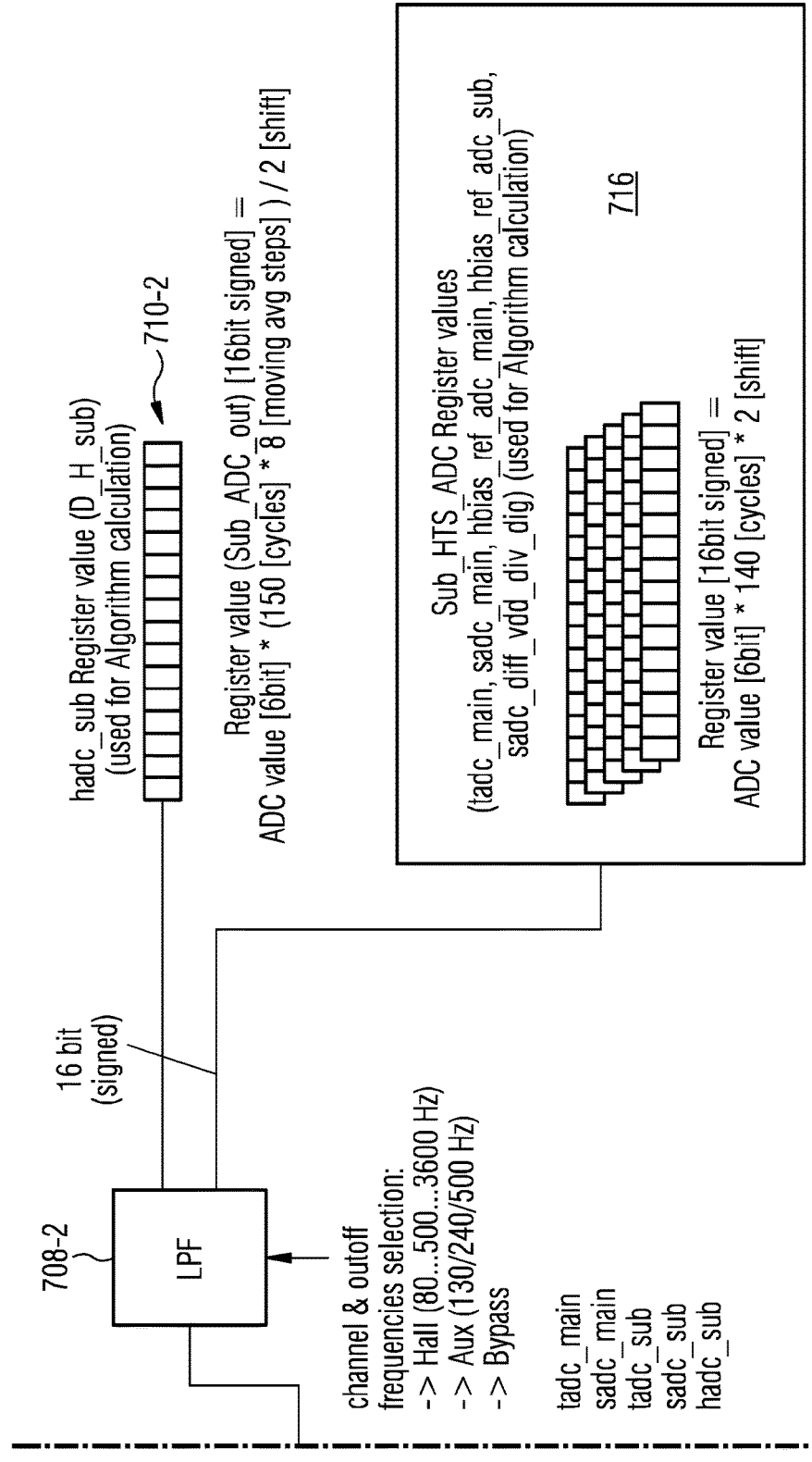
FIG. 7b Part 2

FIG. 8
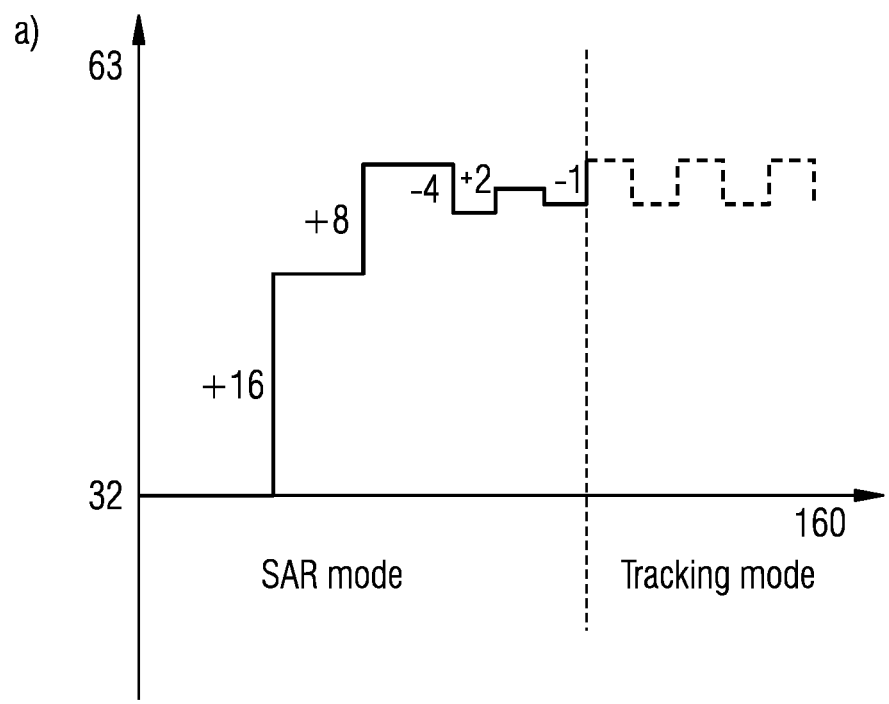
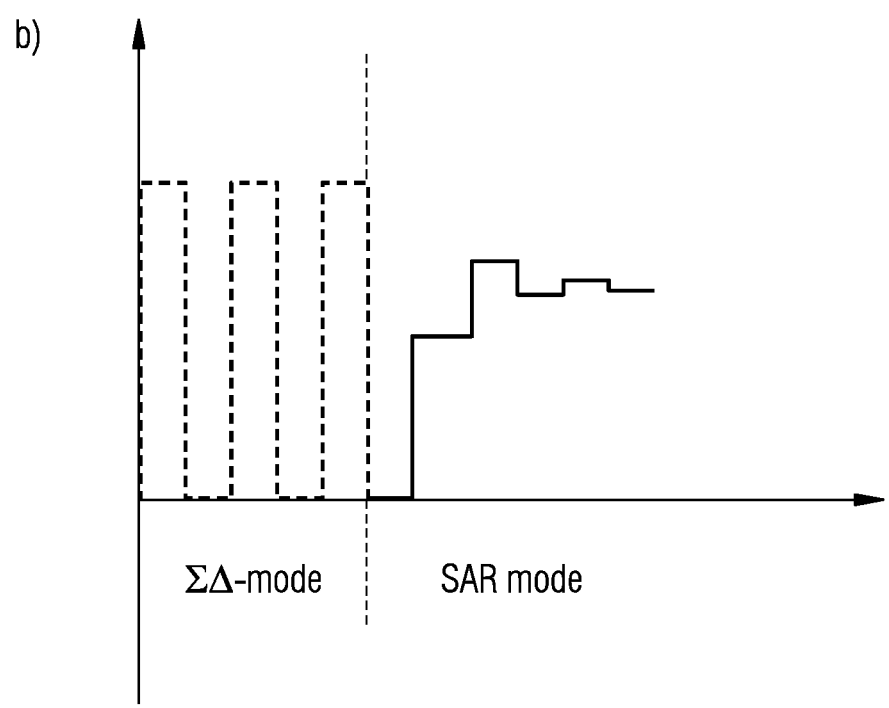

SENSOR CIRCUIT AND SENSING METHOD

FIELD

The present disclosure generally relates to sensor circuits and, more particularly, to redundant sensor concepts for functional safety.

BACKGROUND

Sensors are used in many fields of technology to measure certain physical quantities like temperature, pressure, light intensity, or magnetic fields—just to name a few examples.

Magnetic field sensors, for example, are used in various applications to sense a magnetic field. For example, in order to detect a position or movement a magnet may be mounted to a movable element like a pole wheel or a linear movable element. When the movable element moves, a magnetic field generated by the magnet varies, which may be detected by a magnetic field sensor. Such arrangements may, for example, be used to sense a position, velocity, a tampering of a magnetic field in smart meters or an acceleration. Sometimes, such arrangements and magnetic field sensors are employed in safety critical applications, for example, in the automotive field. In such applications, reliable operation of the magnetic field sensor is important. Furthermore, in such applications it may be desired that faults of the magnetic field sensor are detectable, such that a system where the magnetic field sensor is used may recognize a fault of the magnetic field sensor, for example. In conventional approaches, sometimes redundant magnetic field sensors are provided, for example, a main magnetic field sensor and a possibly smaller auxiliary magnetic field sensor. The main magnetic field sensor and the auxiliary magnetic field sensor may be provided on a same chip die. In other approaches, two separate sensor dies may be assembled in a single package. Outputs of the main and auxiliary magnetic field sensors may be compared, and if they differ by more than a predetermined threshold value, for example, this may indicate a fault condition.

The skilled person having benefit from the present disclosure will appreciate that not only magnetic field sensors but also sensors for other physical quantities may be used in such safety critical applications. Sometimes it may be desirable to combine even more sensors while keeping hardware complexity as low as possible.

SUMMARY

According to a first aspect of the present disclosure, it is provided a sensor circuit comprising a first interface configured to receive a first sensor signal in response to a first measurement of a first physical quantity. A first Analog-to-Digital Converter (ADC) is configured to sample the first sensor signal to generate a sampled first sensor signal. The sensor circuit comprises a second interface configured to receive a second sensor signal in response to a second measurement of the same first physical quantity and at least one third interface configured to receive at least one third sensor signal in response to at least one third measurement of at least one second physical quantity that is different from the first physical quantity. The sensor circuit comprises a multiplexer configured to multiplex the second and the at least one third sensor signal to a multiplexed sensor signal. A second ADC is coupled to the multiplexer and configured to sample the multiplexed sensor signal to generate a sampled multiplexed sensor signal.

In some example implementations, the multiplexer can be configured to time division multiplex the second and the at least one third sensor signal. If the different physical quantities are measured in different frequency bands, the multiplexer could also be configured for frequency division multiplexing, for another example.

In some example implementations, the multiplexer can be configured to multiplex the second and the at least one third sensor signal such that every second output sample is associated with the second sensor signal. If more than two signals are multiplexed, a third sensor signal sample can be arranged in between two consecutive second sensor signal samples, and a fourth sensor signal sample can be arranged in between the next two consecutive second sensor signal samples, on so on.

In some example implementations, the sensor circuit can further comprise a delay circuit configured to cause a sampling delay or phase shift between a sampling interval of the first ADC and a sampling interval of the second ADC. That is to say, the sampling instants of the two ADCs can be phase shifted with respect to each other to cancel a dead time effect caused by multiplexing.

In some example implementations, the sensor circuit can further comprise a first digital filter configured to filter the sampled first sensor signal. The first digital filter has a first filter delay or latency. The sensor circuit can further comprise a second digital filter configured to filter samples of the sampled multiplexed sensor signal which are associated with the second sensor signal. The second digital filter has a second filter delay or latency. A difference between the first filter delay and the second filter delay can correspond to the sampling delay. More particularly, a sum of the second filter delay and the sampling delay may correspond to the first filter delay, leading to substantially the same effective overall processing delay in the two signal paths. The respective digital filters can be implemented as low pass filters. In some example implementations, the filtering can be performed on a subset of the respective sensor signal samples, in particular when using Finite Impulse Response (FIR) filters. In contrast, Infinite Impulse Response (IIR) filtering usually implies a feedback structure, such that an unlimited amount of samples affects the filter output.

In some example implementations, the sampling delay can correspond to a fraction of a multiplexing time slot. In some examples, the fraction can be one half (½) of a multiplexing time slot and/or a sampling interval.

In some example implementations, the sensor circuit can further comprise, a demultiplexer coupled upstream to the second digital filter, and configured to separate samples of the second sensor signal from samples of the at least one third sensor signal comprised of the sampled multiplexed sensor signal. In this way only samples associated with the second sensor signal may be filtered with the second digital filter.

In some example implementations, the second digital filter can be configured to filter the sampled multiplexed sensor signal by weighting samples of the at least one third sensor signal with zero. Alternatively the second digital filter can be configured to filter the sampled multiplexed sensor signal by pausing its filter operation for samples of the at least one third sensor signal. This can isolate the second sensor signal from the third sensor signal and can lead to an average of only the second sensor signal.

In some example implementations, the first physical quantity can be a magnetic field and the second physical quantity is different from this magnetic field (such as temperature, stress, pressure, etc.). Thus, the first sensor signal can be a sensor signal from a first magnetic field sensor and the second sensor signal can be a sensor signal from a second (redundant) magnetic field sensor.

In some example implementations, the third sensor signal can be a sensor signal from one of a stress or temperature sensor.

A known problem of Hall sensors is their offset voltage. The offset voltage is a static or a very low frequency output voltage at the sense contacts of the Hall sensor in the absence of a magnetic field. The causes of offset voltages in integrated Hall devices are imperfections of the fabrication process and non-uniformity of materials. A known offset reduction method is the so-called switched spinning current method. This method can use a Hall plate with eight or more contacts which are symmetrical with respect to rotation by e.g. 45°. The direction of the current is made to spin discretely by contact commutation. Averaging the consecutive Hall voltages can reduce the offset. Thus, in some example implementations related to Hall sensors, the first sensor signal can be a sensor signal from a first Hall sensor operative according to a first spinning current scheme. The second sensor signal can be a sensor signal from a second Hall sensor operative according to a second spinning current scheme. In such cases the first ADC can be configured to continuously generate subsequent samples of the first sensor signal corresponding to subsequent phases of the first spinning current scheme. The second ADC can be configured to continuously sample an output of the multiplexer causing samples of the second sensor signal corresponding to subsequent phases of the second spinning current scheme to be intermitted by samples of the at least one third sensor signal. The first and the second spinning current schemes may in principle be identical, however, they may differ in their respective speed or frequency of contact commutation.

In some example implementations, a ratio between a frequency of subsequent phases of the first spinning current scheme and a frequency of subsequent phases of the second spinning current scheme can correspond to two. Thus, one phase of the second spinning current scheme can last twice as long as one phase of the first spinning current scheme, leading to a frequency of subsequent phases of the first spinning current scheme twice as high as the frequency of subsequent phases of the second spinning current scheme. In some examples this may also hold for more than two multiplexed sensor signals, if the sensor signals are multiplexed such that every second output sample is associated with the second sensor signal. A complete cycle of a spinning current scheme typically consists of an integer number (>1) of phases. For example, a complete cycle of a spinning current scheme can consist of four or eight phases.

In some example implementations related to spinning current schemes, the sensor circuit can further comprise a delay circuit configured to delay a sampling interval of the second ADC vis-à-vis a sampling interval of the first ADC by a sampling delay corresponding to a fraction of a multiplexing time slot. In some examples, the fraction can be fixed to one half (½) of a multiplexing time slot or a sampling interval.

In some example implementations related to spinning current schemes, the sensor circuit can further comprise a first digital moving average filter configured to filter the sampled first sensor signal. The first digital moving average filter has a first filter delay (or latency) and a first filter length covering a plurality of cycles of the first spinning current scheme (e.g. exactly two cycles). The sensor circuit can further comprise a second digital moving average filter configured to filter samples of the sampled multiplexed sensor signal which are associated with the second sensor signal. The second digital moving average filter has a second filter delay (or latency) and a second filter length covering at least one cycle of the second spinning current scheme (e.g. exactly one cycle). A sum of the second filter delay and the sampling delay corresponds to the first filter delay.

In some example implementations, the sensor circuit can further optionally comprise a control circuit configured to compare one or more samples derived from the first sensor signal against one or more samples derived from the second sensor signal and to perform a functional safety measure in case a deviation of the compared samples exceeds a predefined threshold. The functional safety measure or function can include generating a warning signal, causing a reset of the sensor circuit, or blocking an interface to other external components, for example. While the control unit can be internal circuitry integrated on a common substrate or within a common package with other components of the sensor circuit, the electronic control unit could also be an external device, such as a vehicle's ECU (Electronic Control Unit) controlling one or more of the electrical system or subsystems in a transport vehicle.

In some example implementations, the sensor circuit can be an Integrated Circuit (IC). This sensor IC can be communicatively coupled to other devices, such as, for example, an ECU.

According to a further aspect of the present disclosure, it is provided a sensor system comprising a first Hall sensor configured to measure a magnetic field and to generate a first sensor signal based on the measurement. A first ADC is configured to sample the first sensor signal to generate a sampled first sensor signal. A second Hall sensor is configured to measure the same magnetic field and to generate a second sensor signal based on the measurement. At least one third sensor is configured to measure at least one different physical quantity and to generate at least one third sensor signal based on the measurement. A time division multiplexer is configured to output either the second or the at least one third sensor signal in a temporally alternating pattern to generate a multiplexed sensor signal. A second ADC is coupled to the multiplexer and configured to sample the multiplexed sensor signal to generate a sampled multiplexed sensor signal. A delay circuitry is configured to cause a sampling delay between a sampling interval of the first ADC and a sampling interval of the second ADC. A first digital moving average filter having a first filter delay (or latency) is configured to filter the sampled first sensor signal. A second digital moving average filter having a second filter delay (or latency) is configured to filter samples of the sampled multiplexed sensor signal which are associated with the second sensor signal. A difference between the first filter delay and the second filter delay corresponds to the sampling delay.

In some example implementations, the first Hall sensor is operative according to first spinning current scheme and the second Hall sensor is operative according to second spinning current scheme. In some example implementations, a ratio between a frequency of subsequent phases of the first spinning current scheme and a frequency of subsequent phases of the second spinning current scheme can correspond to two. The first ADC is configured to continuously sample the first sensor signal causing subsequent samples of the first sensor signal corresponding to subsequent phases of the first spinning current scheme. The second ADC is configured to continuously sample an output of the time division multiplexer causing samples of the second sensor signal corresponding to subsequent phases of the second spinning current scheme to be intermitted by samples of the at least one third sensor signal.

In some example implementations, the second digital moving average filter is configured to filter an output of the second ADC by disregarding samples of the at least one third sensor signal.

According to a yet a further aspect of the present disclosure, it is provided sensing method. The method comprises providing a first sensor signal in response to a first measurement of a first physical quantity, providing a second sensor signal in response to a second measurement of the same first physical quantity, providing at least one third sensor signal in response to at least one third measurement of at least one different physical quantity that is different from the first physical quantity, multiplexing the second and the at least one third sensor signal to generate a multiplexed sensor signal, sampling the first sensor signal with a first ADC to obtain a sampled first sensor signal, and sampling the multiplexed sensor signal with a second ADC to obtain a sampled multiplexed sensor signal.

In some example implementations, the method can further comprise causing a sampling delay between a sampling interval of the first ADC and a sampling interval of the second ADC, filtering the sampled first sensor signal with a first digital filter, filtering samples of the sampled multiplexed sensor signal which are associated with the second sensor signal with a second low pass filter, wherein a difference between a first filter delay of the first low pass filter and a second filter delay of the second low pass filter corresponds to the sampling delay. In some example implementations, a sum of the second filter delay and the sampling delay can correspond to the first filter delay. In some example implementations, the sampling delay can correspond to half a multiplexing time slot.

In some example implementations, filtering the output of the second ADC can comprise disregarding samples of the at least one third sensor signal.

In some example implementations, the first sensor signal can be a sensor signal from a first Hall sensor operative according to first a spinning current scheme and the second sensor signal can be a sensor signal from a second Hall sensor operative according to a second spinning current scheme. Filtering the output of the first ADC can comprise averaging a first number of phases of the first spinning current scheme and filtering the output of the second ADC can comprise averaging a different second number of phases of the second spinning current scheme.

Although the second ADC is used to also sample one or more third auxiliary channels, the present disclosure provides concepts allowing comparisons between the first and the second sensor signal with minimum latency difference.

BRIEF DESCRIPTION OF THE FIGURES

Some examples of apparatuses and/or methods will be described in the following by way of example only, and with reference to the accompanying figures, in which

FIG. 5 illustrates an example of a spinning current scheme with eight operating phases per cycle;

FIG. 6 show a relative timing between an output of a first ADC and an output of a second ADC and respective filtering;

FIGS. 7a and 7b show examples of signal processing chains of a first and second ADC channel; and FIG. 8 illustrates a concept of hybrid ADCs.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
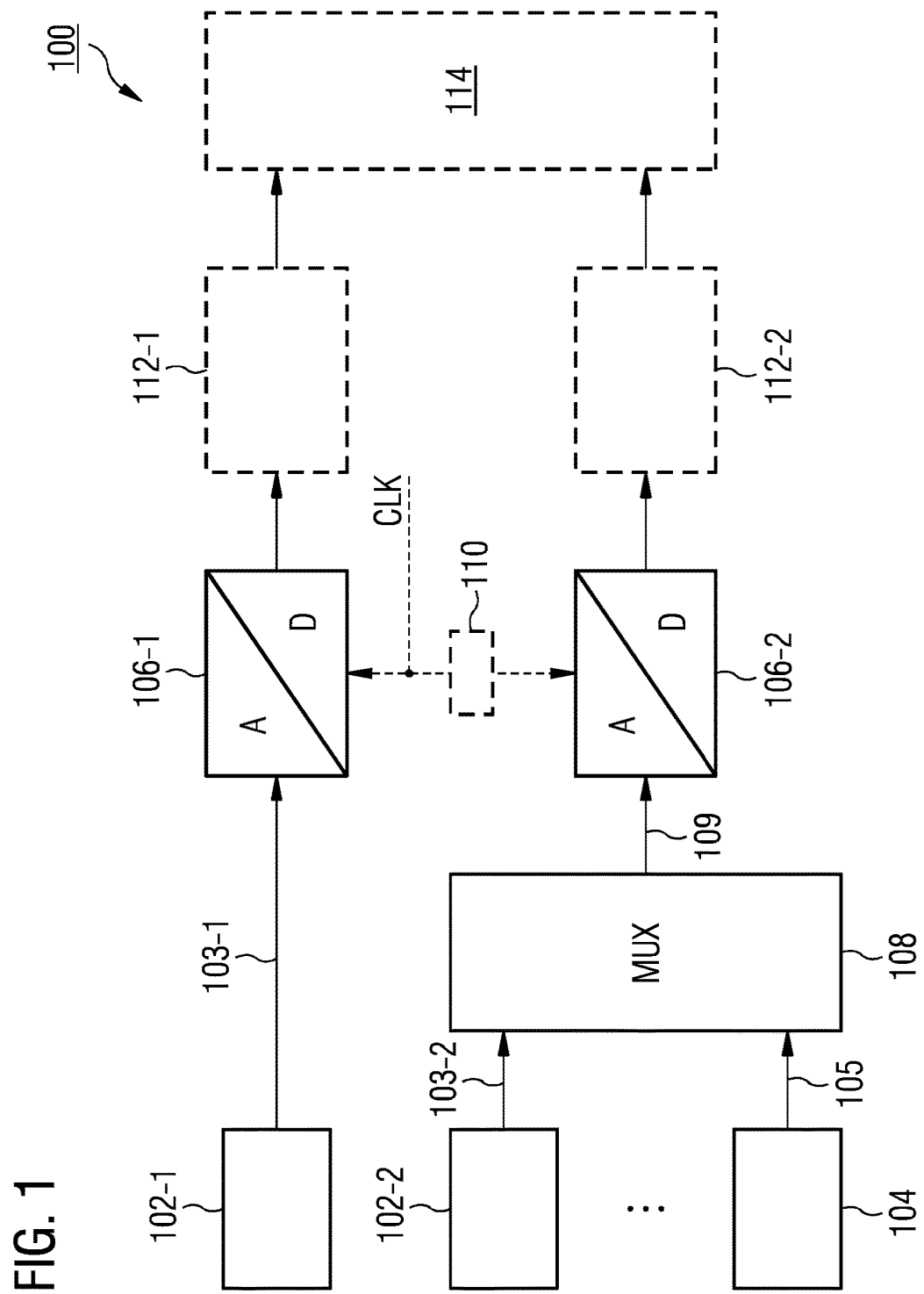
FIG. 1 shows a schematic block diagram of an example sensor circuit according to the present disclosure.

FIG. 1 schematically illustrates a sensor circuit 100 according to an example of the present disclosure. Sensor circuit 100 interfaces with a first sensor 102-1 which is configured to sense a first physical quantity. First sensor 102-1 generates a first (analog) sensor signal 103-1 based on a measurement of the first physical quantity. A first ADC 106-1 of sensor circuit 100 is configured to sample the first sensor signal 103-1. Sensor circuit 100 further interfaces with a second sensor 102-2 which is configured to measure the same first physical quantity. Sensor 102-2 generates a second sensor signal 103-2 based on a measurement of the first physical quantity. Sensor circuit 100 further interfaces with at least one third sensor 104 which is configured to measure a different second physical quantity. Sensor 104 generates a third sensor signal 105 based on its measurement. Sensor circuit 100 also comprises a multiplexer 108 which is configured to multiplex the second and the at least one third sensor signals 102-2, 105 to generate a multiplexed sensor signal 109. A second ADC 106-2 of sensor circuit 100 is coupled to the multiplexer's output and configured to sample the multiplexed sensor signal 109.

ADCs 106-1, 106-2 may operate according to various known ADC principles, such as direct conversion type ADCs, successive approximation ADC, or tracking type ADCs, just to name a few examples. Thus, "sampling" refers to analog-to-digital conversion in general including various types of analog-to-digital conversion principles.

In some example implementations, sensor circuit 100 can be an Integrated Circuit (IC) with its components being integrated on a common semiconductor substrate or separate dies integrated into a common semiconductor package.

In some example implementations, the first and the second sensors 102-1, 102-2 can both be magnetic field sensors, such as Hall sensors or magneto-resistive sensors, for measuring the same external magnetic field as first physical quantity. The skilled person will appreciate, however, that the first and the second sensors 102-1, 102-2 need not be magnetic field sensors but can be of arbitrary (but the same) type. Thus, both sensors could also be pressure, stress or temperature sensors, for example. The third sensor 104 can be of a different sensor type compared to the first and the second sensors 102-1, 102-2. It can be a pressure, stress or temperature sensor, for example. Such a combination of different sensors can be useful for automotive applications, for example.

In some example implementations, the multiplexer 108 can be configured for time division multiplexing the second and the at least one third sensor signals 102-2, 105. If the different physical quantities are measured in different frequency bands, the multiplexer 108 could also be configured for frequency division multiplexing, for another example. Other multiplexing techniques are also conceivable, if the nature of the sensor signal(s) allows for it.

In some example implementations, the sensor circuit 100 can comprise a delay circuit 110 which is configured to cause a sampling delay or phase shift between a sampling instant of the first ADC 106-1 and a sampling instant of the second ADC 106-2. Apart from that the ADCs 106-1 and 106-2 can have identical sampling frequencies, which translates into identical sampling intervals or sample durations. In one example implementation, the sampling delay can be generated by providing a phase shifted clock signal CLK to the second ADC 106-2. Thus, delay circuit 110 could comprise an analog or digital phase shift circuitry. In some examples, this sampling delay or phase shift may correspond to a fraction (e.g. ½) of a multiplexing time slot of multiplexer 108. Thereby a multiplexing time slot denotes a time slot during which the multiplexer 108 switches one of its input signals to its output. A sampling interval or sample duration of ADCs 106-1 and 106-2 may correspond to a duration of a multiplexing time slot. In some examples it may be beneficial to have an adaptive delay or phase shift which can be adjusted according to different needs or sensor circuit setups.

In some example implementations, the sensor circuit 100 can comprise a first digital filter 112-1 coupled to the output of ADC 106-1 and a second digital filter 112-2 coupled to the output of ADC 106-2. Note that the sampled second sensor signal 103-2 as well as the at least one sampled third sensor signal 105 can both be (alternatingly) fed to the second digital filter 112-2 in some examples. In other examples, a demultiplexer can separate the sampled second sensor signal 103-2 from the at least one sampled third sensor signal 105 before filtering. The first digital filter 112-1 can have a first filter delay (or latency), the second digital filter 112-2 can have a second filter delay (or latency). The first filter delay and/or the second filter delay can be chosen based on the sampling delay or phase shift between the sampling instants of the first ADC 106-1 and the sampling instants of the second ADC 106-2. For example, a difference between the first filter delay and the second filter delay may correspond to the sampling delay. In particular, a sum of the sampling delay and the second filter delay can correspond to the first filter delay such that both signal paths experience substantially the same effective processing delay (same latency delay). This time alignment can be generated with an adequate sampling delay between the two signal paths and/or with adequate filter lengths. For example, if the sampling delay corresponds to half a multiplexing time slot, the temporal delay caused by filtering the sampled first sensor signal with the first digital filter can differ from the temporal delay caused by filtering the sampled second sensor signal with the second digital filter by half a multiplexing time slot. In particular, the second filter delay may be shorter by half a multiplexing time slot. Thus, the overall processing delay of both signal paths will be substantially identical.

In some example implementations, the digital filters 112-1, 112-2 can be implemented as respective low pass filters. One option would be to use Finite Impulse Response (FIR) filters, while in other examples the filters 112-1, 112-2 could also be implemented as respective Infinite Impulse Response (IIR) filters. The digital low pass filters 112-1, 112-2 can also be regarded as respective averaging filters.

In some example implementations, the sensor circuit 100 can further optionally comprise a control unit 114 which is configured to compare (filtered) samples derived from the first sensor signal 103-1 against (filtered) samples derived from the second sensor signal 103-1 and to perform one or more functional safety functions in case a difference between the compared samples exceeds a predefined threshold. In other words, the respective filter outputs can be compared with each other. The mentioned one or more functional safety functions or measures can include generating a warning signal, causing a reset of the sensor circuit 100 or blocking an interface (not shown) to other external components, for example. While the control unit 114 can be internal circuitry integrated on a common substrate or within a common package with other components of the sensor circuit 100, the control unit 114 could also be a device external to the sensor circuit 100, such as a vehicle's ECU (Electronic Control Unit) controlling one or more of the electrical systems or subsystems in the vehicle.

Figure 2:
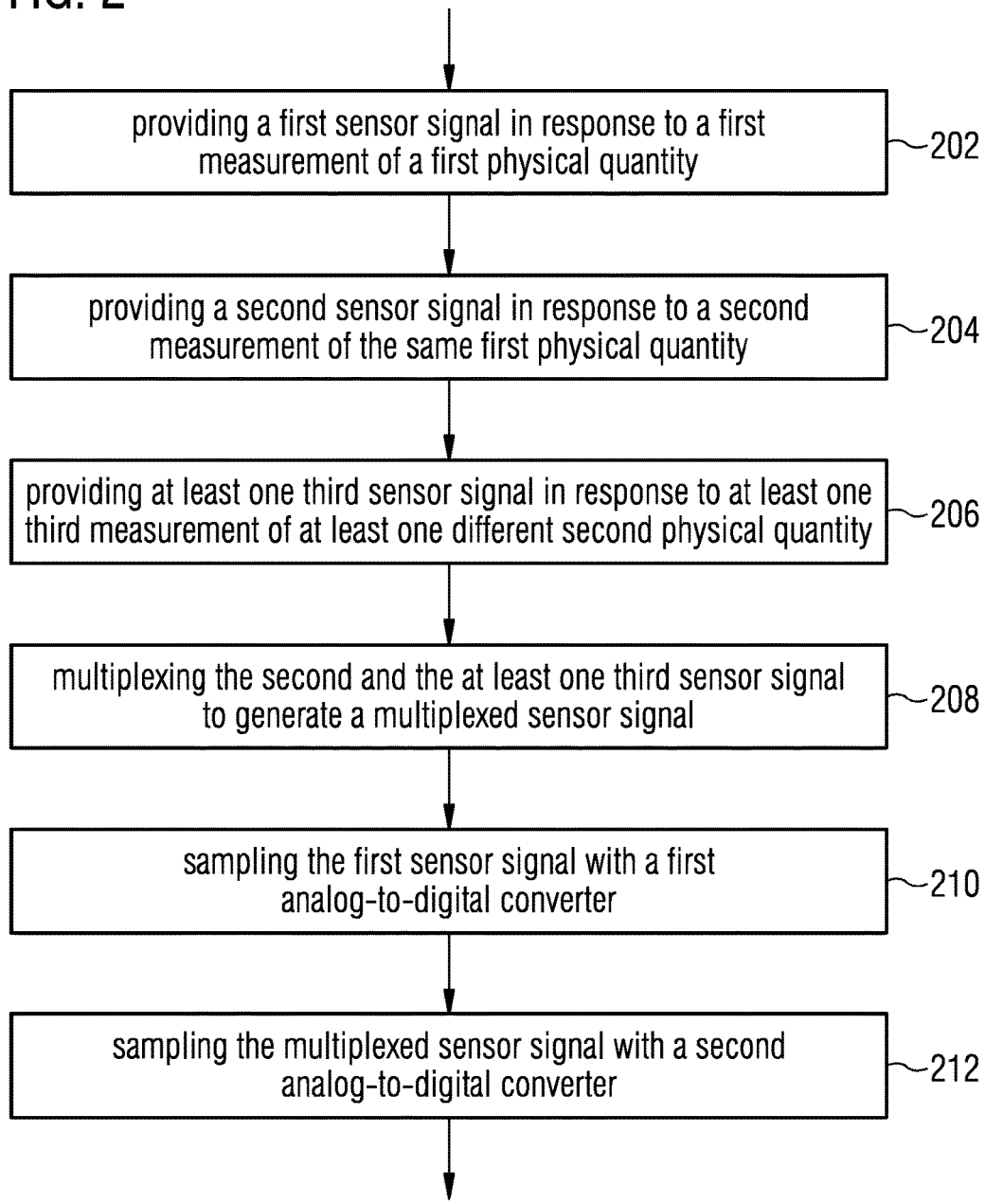
FIG. 2 shows a flowchart of a sensing method according to the present disclosure.

The skilled person having benefit from the present disclosure will appreciate that sensor circuit 100, when in operation, performs a corresponding sensing method, which is illustrated in FIG. 2.

Sensing method 200 includes providing 202 the first sensor signal 103-1 in response to a first measurement of a first physical quantity, providing 204 the second sensor signal 103-2 in response to a second measurement of the same first physical quantity, providing 206 the at least one third sensor signal 105 in response to at least one third measurement of at least one different second physical quantity, multiplexing 208 the second and the at least one third sensor signal to generate a multiplexed sensor signal 109, sampling 210 the first sensor signal with the first ADC 106-1, and sampling 212 the multiplexed sensor signal 109 with the second ADC 106-2.

Further, as has been described before, method 200 may optionally include causing a sampling delay or phase shift between sampling instants of the first ADC 106-1 and corresponding sampling instants of the second ADC 106-2. An output of the first ADC 106-1 may be filtered with a first low pass filter 112-1 in order to generate a filtered first sensor signal, while the output of the second ADC 106-2 may be filtered with a second low pass filter 112-2 in order to generate a filtered second sensor signal. For that purpose, filtering the output of the second ADC 106-2 may comprise disregarding intermittent samples of the at least one third sensor signal 105. A difference between a first filter delay of the first low pass filter 112-1 and a second filter delay of the second low pass filter 112-2 may correspond to the sampling delay. In particular, the sum of the second filter delay and the sampling delay may correspond to the first filter delay in order to achieve overall identical processing delays for the filtered first and second sensor signals. The sampling delay or sampling phase difference between the two ADC channels may be half a sample time interval.

Figure 3:
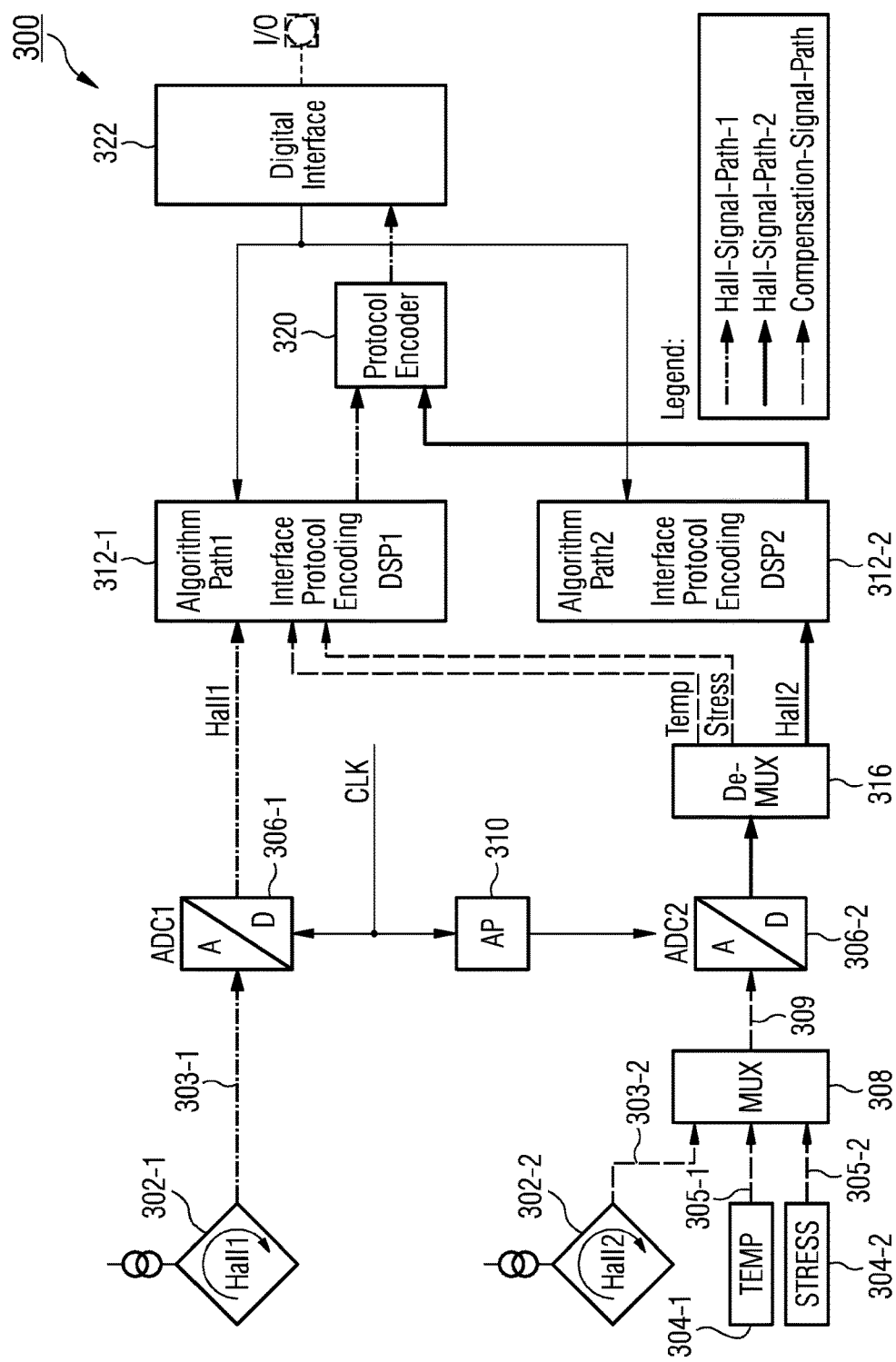
FIG. 3 shows a block diagram of a further example sensor circuit according to the present disclosure.

An example relating to a redundant measurement of a magnetic field with two Hall sensors and additional sensors will now be detailed with respect to FIG. 3.

FIG. 3 shows a sensor system 300 comprising a first Hall sensor 302-1 to measure an external magnetic field (for example generated by a rotating shaft or the like) and to generate a first sensor signal 303-1 based on this measurement. A first ADC 306-1 is coupled to the first Hall sensor's output and is configured to sample the first sensor signal 303-1. Sensor system 300 comprises a second Hall sensor 302-2 to measure the same external magnetic field and to generate a second sensor signal 303-2 based on its measurement. Sensor system 300 also comprises a temperature sensor 304-1 to measure an ambient temperature and to generate a third sensor signal 305-1 based on the temperature measurement. Sensor system 300 further comprises a stress sensor 304-2 to measure a mechanical stress and to generate a fourth sensor signal 305-2 based on the stress measurement. A time division multiplexer 308 is coupled to the outputs of sensors 302-2, 304-1, and 304-2 and is configured to multiplex the respective sensor signals 303-2, 305-1, and 305-2 in a temporally alternating manner to obtain a time multiplexed sensor signal 309. In an example implementation, multiplexer 308 can be configured for the following multiplexing order: second sensor signal 303-2, third sensor signal 305-1, second sensor signal 303-2, fourth sensor signal 305-2, second sensor signal 303-2, third sensor signal 305-1, second sensor signal 303-2, fourth sensor signal 305-2, etc. A second ADC 306-2 is coupled to the time division multiplexer's output and is configured to sample the time multiplexed sensor signal 309 at least once per multiplexing time slot. In this way, ADC 306-2 provides a sample stream at its output, which can have the following order: sample of second sensor signal 303-2, sample of third sensor signal 305-1, sample of second sensor signal 303-2, sample of fourth sensor signal 305-2, sample of second sensor signal 303-2, sample of third sensor signal 305-1, sample of second sensor signal 303-2, sample of fourth sensor signal 305-2, etc.

Delay circuitry 310 is configured to cause a sampling delay or phase shift between corresponding sampling instants of the first ADC 306-1 and the second ADC 306-2. In other words, the second ADC 306-2 is phase delayed with respect to the first ADC 306-1. Apart from that both ADCs 306-1 and 306-2 can be operative with the same sampling frequency. The latter can be dependent on or correspond to the multiplexing frequency of multiplexer 308.

A first digital moving average filter in digital signal processor 312-1 is configured to filter an output of the first ADC 306-1. This first digital filter, which may be an FIR low pass filter, has a corresponding first filter delay or latency. A second digital moving average filter in digital signal processor 312-2 is configured to filter an output of the second ADC 306-2. In particular, it is configured to filter samples corresponding to the second sensor signal 303-2. For this purpose a demultiplexer 316 may be used. The second digital filter can have a second, shorter or longer filter delay/latency, wherein a difference between the first filter delay and the second filter delay corresponds to the sampling delay.

According to the underlying principle, the ADC channels of ADC 306-1 and ADC 306-2 are phase shifted to each other in order to cancel the dead time effect caused by time-multiplexing. The respective center points of the moving averaged signals can be equalized, leading to substantially the same signal latency for the two signal paths. This will be explained in more detail with reference to FIG. 4.

Figure 4:
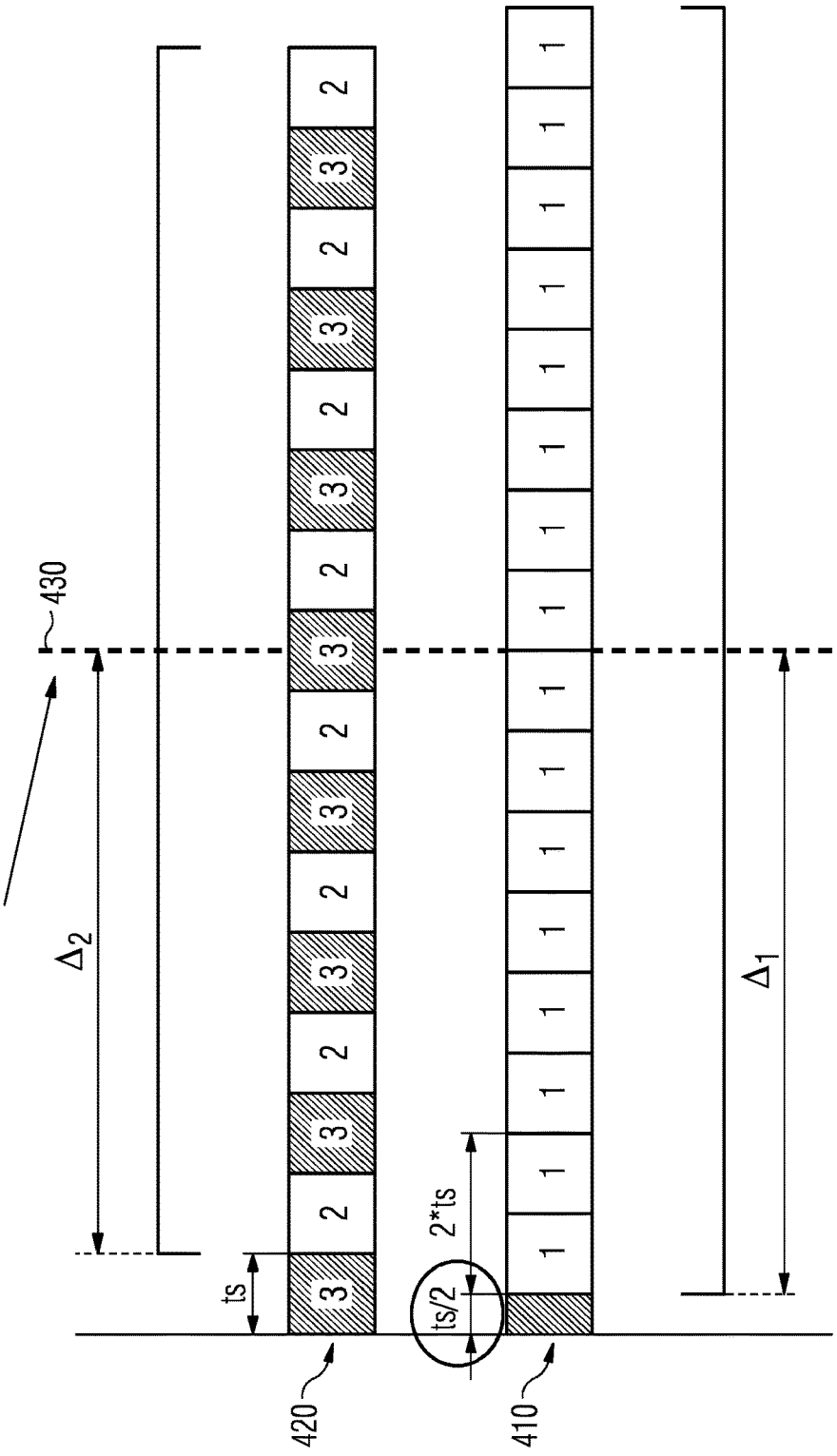
FIG. 4 shows an example of relative timing between an output of a first ADC and an output of a second ADC.

FIG. 4 schematically illustrates two sample streams 410 and 420. While sample stream 410 corresponds to the output of the first ADC 306-1 and only contains continuous samples of the first sensor signal 303-1 (denoted by "1"), sample stream 420 corresponds to the output of the second ADC 306-2 and contains samples of the second sensor signal 303-2 (denoted by "2") as well as samples of at least one third sensor signal 305 (denoted by "3") in a time-multiplexed manner. The samples of the at least one third sensor signal 305 intermit the samples of the second sensor signal 303-2. A sample duration or a sampling interval is denoted by "ts". In one example, ts can correspond to 16 μs. As can be seen, the two sample streams 410 and 420 are phase shifted by half a sampling interval ts/2. In other words, the phase shift between the two sample streams 410 and 420 is π. If ts=16 μs, the delay or phase shift between the two sample streams 410 and 420 would correspond to 8 μs. Sample stream 410 is filtered using a first digital moving average filter causing a first filter delay $\Delta_1$, while sample stream 410 is filtered using a second digital moving average filter causing a second filter delay $\Delta_2$. The second filter delay $\Delta_2$ can be slightly shorter than the first filter delay $\Delta_1$. In particular, the second filter delay $\Delta_2$ can be shorter by ts/2. Thus, the center points of the two filtered signal paths are time aligned, as indicated by dotted line 430. In the illustrated example, the filter length of the first digital moving average filter corresponds to $2\Delta_1$, the filter length of the second digital moving average filter corresponds to $2\Delta_2$. Consequently, the filter length of the second digital moving average filter is shorter by 2ts/2=ts (one sampling interval).

When determining a first moving average with the first digital moving average filter, all samples "1" of the first sensor signal 303-1 in the filter can be used. When determining a second moving average with the second digital moving average filter, only the samples "2" in the filter corresponding to the second sensor signal 303-2 (e.g., only every second sample) should be used. The samples "3" corresponding to the third sensor signal 305 should be discarded. This can be done, for example, by weighting the samples corresponding to the third sensor signal 305 with zero. On the other hand, the samples corresponding to the second sensor signal 303-2 can be weighted by two. As can be seen from the example of FIG. 4, the first digital moving average filter can use twice the number of useful samples for determining its moving average than the second digital moving average filter.

In some example implementations related to Hall sensors, spinning current schemes can be used. As known for spinning current principles, supply- and sense-terminals of Hall sensor devices can be exchanged in consecutive clock phases/operating phases. FIG. 5 shows an example of a spinning current scheme with eight operating phases. The eight operating phases make up one measurement cycle. In the illustrated example, the Hall device comprises a bridge circuit 500 with one Hall plate 502 (R+ΔR) and three resistors 504 (R). Supply contacts (current source 506 and ground) and sense contacts (of the (chopped) differential amplifier 508) of the bridge circuit 500 differ in each operating phase. If the sensed voltages of all operating phases are summed up or averaged, unwanted offset voltages VOh (the offset coming from the Hall plate) and VOa (the offset coming from the amplifier) can be cancelled out. Although FIG. 5 depicts a combination of spinning current and chopping, the skilled person having benefit from the present disclosure will appreciate that both concepts can be used separately as well, depending on the application and/or employed sensors.

Thus, subsequent samples of the first sensor signal 303-1 (denoted by "1" in FIG. 4) and the of the second sensor signal 303-2 (denoted by "2" in FIG. 4) can correspond to subsequent chopping phases (e.g. two chopping phases) of a chopping scheme. This could be the case for a magneto-resistive sensor with a chopped ADC input stage, for example. A chopper circuit can convert fixed DC input to a variable DC output directly. Essentially, a chopper is an electronic switch that is used to interrupt one signal under the control of another. Additionally or alternatively, subsequent samples of the first sensor signal 303-1 (denoted by "1" in FIG. 4) and the of the second sensor signal 303-2 (denoted by "2" in FIG. 4) can correspond to subsequent operating phases of respective spinning current schemes. That is, the first Hall sensor 302-1 can be operative according to first spinning current scheme. The second Hall sensor 302-2 can be operative according to a second spinning current scheme. The first ADC 306-1 can be configured to continuously generate subsequent samples of the first sensor signal 303-1 corresponding to subsequent operating phases of the first spinning current scheme. The second ADC 306-2 can be configured to continuously sample an output of the multiplexer 308 causing samples of the second sensor signal corresponding to subsequent phases of the second spinning current scheme to be intermitted by samples of the at least one third sensor signal 305-1 or 305-2. Such an example is shown in FIG. 6.

FIG. 6 schematically illustrates two sample streams 610 and 620. While sample stream 610 corresponds to the output of the first ADC 306-1 and only contains continuous samples of the first sensor signal 303-1 (here denoted by "main"), sample stream 620 corresponds to the output of the second ADC 306-2 and contains samples of the second sensor signal 303-2 (here denoted by "sub") as well as samples of at least one third sensor signal 305 (here denoted by "AUX") in a time-multiplexed manner. The samples of the at least one third sensor signal 305 intermit the samples of the second sensor signal 303-2. Subsequent samples of the first sample stream 610 correspond to subsequent operating phases of the first Hall sensor's 302-1 first spinning current scheme. Subsequent samples of the second sensor signal 303-2 in the second sample stream 620 correspond to subsequent operating phases of the second Hall sensor's 302-2 second spinning current scheme. Here, both spinning current schemes contain eight operating phases per cycle, respectively. The skilled person having benefit from the present disclosure will appreciate that other numbers of operating phases are possible as well. In the illustrated example, the ratio between a frequency of subsequent operating phases of the first spinning current scheme and a frequency of subsequent operating phases of the second spinning current scheme substantially corresponds to two. That is, operating phases are changed substantially twice as fast in the first spinning current scheme compared to the second spinning current scheme.

In the example of FIG. 6, an eight-tap moving average FIR filter can be assumed for the first sensor signal 303-1 as well as for the second sensor signal 303-2.

Figure 7A:
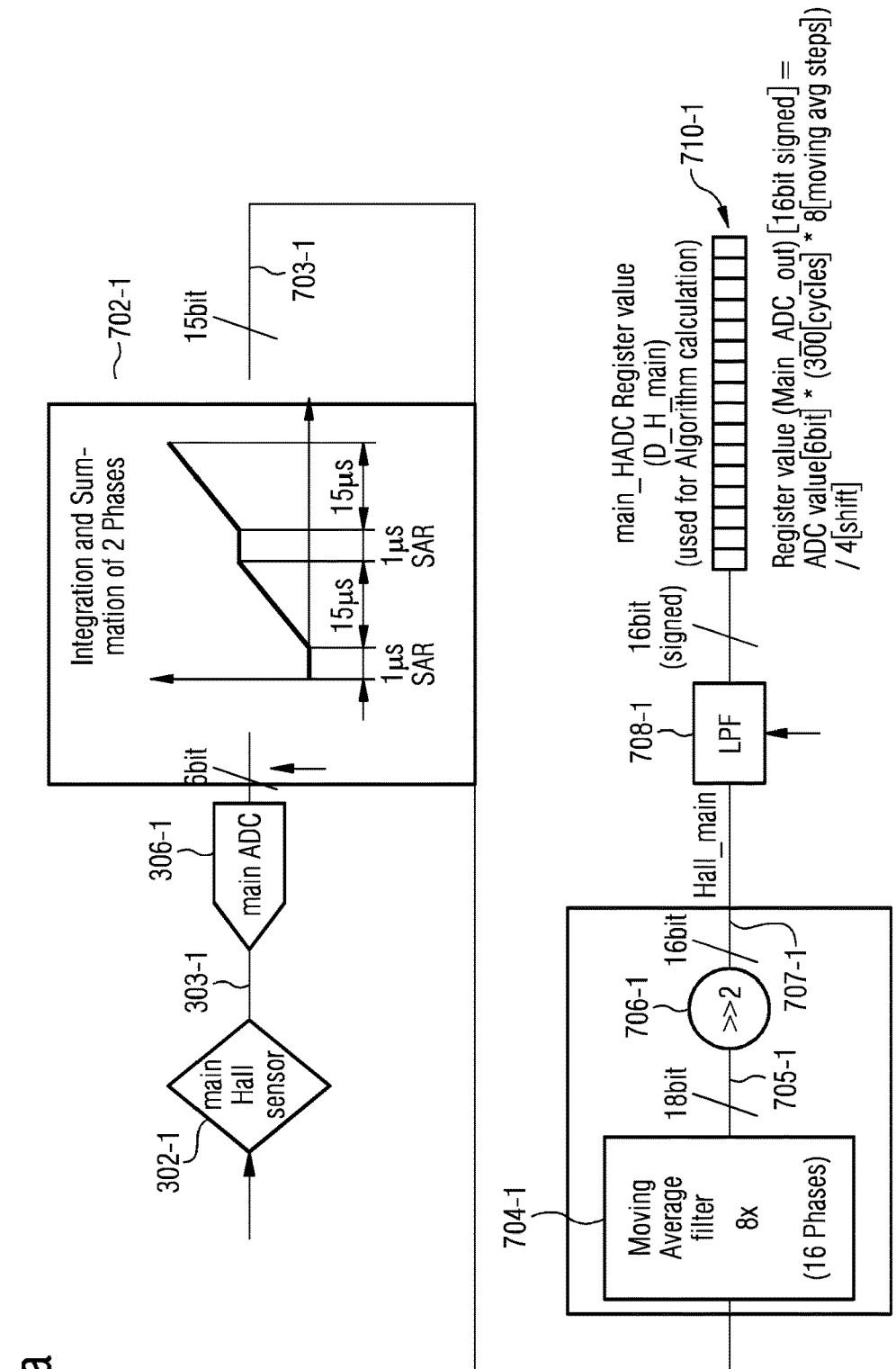

In the illustrated example, an effective first moving average filter length $2\Delta_1$ corresponds to two measurement cycles (2×8=16 operating phases) of the first spinning current scheme. Since only eight filter taps are available, two consecutive samples of two consecutive operating phases can be summed up to a summed value, leading to eight summed values that can be fed into the first eight-tap moving average FIR filter. This is illustrated in FIG. 7a.

An analog first sensor signal from the first Hall sensor 302-1 is sampled by first or main ADC 306-1. Samples of the first ADC's output can have a bit-width of 6 bits, for example. In a first integration stage 702-1 coupled to the first ADC's output two consecutive samples corresponding to two consecutive operating phases of the first spinning current scheme can be integrated or summed to a summed value. An output value 703-1 of the integration stage 702-1 can have a bit-width of 15 bits, for example. Eight output values 703-1 of the integration stage 702-1 corresponding to 16 consecutive operating phases can be fed into a first eight-tap moving average filter 704-1. A filter output 705-1 can have a bit-width of 18 bits, for example. The filter output 705-1 can then be divided by four, corresponding to a bit-shift by two (to the right). This results in an example bit-width of 16. The resulting values 707-1 can then be fed to an optional Low-Pass Filter LPF 708-1 before the are written into a main ADC register 710-1 for further processing. LPF 708-1 can be used to cancel unwanted signal components, for example.

In the illustrated example of FIG. 6, an effective second moving average filter length $2\Delta_2$ corresponds to one measurement cycle (1×8=8 operating phases) of the second spinning current scheme. Since only every second sample of sample stream 620 corresponds to the second Hall sensor signal 302-2, the samples corresponding to the at least one third sensor signal 305 have to be taken out of consideration. This can either be done by weighting them with zero, pausing the moving average filter operation for samples corresponding to the at least one third sensor signal 305, or by de-multiplexing the multiplexed sample stream 620. The latter option is illustrated in FIG. 7b.

An analog second Hall sensor signal 303-2 from the second Hall sensor 302-1 is multiplexed with one or more further analog sensor signals 305 from one or more further sensors 305. The resulting multiplexed signal is then sampled by the second ADC 306-2.

For example, the second ADC 306-2 can sample input data in the following sequence (multiplexed by the Mux block 308):

Temperature main
Hall-Phase 1
Stress main
Hall-Phase 2

Temperature sub
Hall-Phase 3
Stress sub
Hall-Phase 4
bias main
Hall-Phase 5
v_bg_diff
Hall-Phase 6
Stress main diff
Hall-Phase 7
Stress sub diff
Hall-Phase 8

Thus, every second sample is related to Hall sensor 302-2, while the intermittent samples are related to other sensors. Samples of the second ADC's output can have a bit-width of 6 bits, for example. The second ADC's output is de-multiplexed such that de-multiplexed samples corresponding to the second Hall sensor signal 303-2 can be fed to a second integration stage 702-2. An output value 703-2 of the integration stage 702-2 can have a bit-width of 14 bits, for example. Eight output values 703-2 of the integration stage 702-2 corresponding to eight consecutive operating phases of the second spinning current scheme can be fed into a second eight-tap moving average filter 704-2. A filter output 705-2 can have a bit-width of 17 bits, for example. The filter output 705-2 can then be divided by two, corresponding to a bit-shift by one. The resulting values 707-2 can then be fed to an optional Low-Pass Filter LPF 708-2 before they are written into a sub ADC register 710-2 for further processing.

De-multiplexed samples corresponding to the one or more further sensor signals 305 can be fed to a further integration stage 712. An output value 713 of the further integration stage 712 can have a bit-width of 14 bits, for example. The output value 713 can then be multiplied by four, corresponding to a bit-shift by two (to the left). The resulting values 715 can then also be fed to the optional Low-Pass Filter LPF 708-2 before they are written into corresponding registers 716 for further processing.

The contents of registers 710-1, 710-2, and 716 can be forwarded from the DSPs 312-1 and 312-2 to a protocol encoder 320 where they can be combined in a digital communication protocol, e.g. with separated data channel for each signal path, and transmitted via a digital interface 322 and I/O pad to an External Control Unit (ECU). The ECU can additionally perform a signal comparison between the two measurement values of registers 710-1 and 710-2. Thus, a minimized latency between the two values is required.

As shown in FIG. 8, the first and second ADCs 306-1 and 306-2 can be hybrid ADCs that may start with a Successive Approximation Register (SAR) algorithm and may then switch to tracking mode (or sigma-delta mode), see FIG. 8a. A hybrid solution implementing the other way ($1^{st}$ order continuous time digital tracking multi-bit delta-sigma modulator and then SAR) is shown in FIG. 8b. Such hybrid ADCs may lead to inherent analog filtering, rejection of EMC and alias disturbances. Further it can provide high resolution in a short time with low power.

Examples of the present disclosure may enable internal or external signal comparisons of redundant sensor signals with minimum latency difference between the signals. The $2^{nd}$ ADC can be used additionally to measure auxiliary channels (e.g. temperature or stress sensors or internal biasing voltages). This measurement can be time-multiplexed with the measurement of the main sensor signal, leading to area saving as no $3^{rd}$ ADC is needed.

In some examples, two different ADCs and signal processing circuits and two Hall sensors can be implemented on one sensor-IC to provide redundancy and diversity. The second ADC can be multiplexed to other measurement channels between subsequent measurement phases. Two synchronized digital sliding averaging sensor and ADC channels with different averaging time but the same effective averaging delay (same latency delay) can be provided. For example, one ADC can run with continuous conversion while the second ADC can run with multiplexed conversion. The ADC channels can be phase shifted to each other to cancel the dead time effect caused by time-multiplexing. The center point of moving averaged signals can be equalized, leading to the same latency to output.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A sensor circuit, comprising:
a first interface configured to receive, from a first Hall sensor operative according to a first spinning current scheme, a first sensor signal in response to a first measurement of a first physical quantity;
a first analog-to-digital converter configured to sample the first sensor signal to generate a sampled first sensor signal, and to generate subsequent samples of the first sensor signal corresponding to subsequent phases of the first spinning current scheme;
a second interface configured to receive, from a second Hall sensor operative according to a second spinning current scheme, a second sensor signal in response to a second measurement of the same first physical quantity;
a third interface configured to receive at least one third sensor signal in response to at least one third measurement of at least one second physical quantity that is different from the first physical quantity;
a multiplexer configured to multiplex the second and the at least one third sensor signal to a multiplexed sensor signal; and
a second analog-to-digital converter coupled to the multiplexer and configured to sample the multiplexed sensor signal to generate a sampled multiplexed sensor signal, and to continuously sample an output of the multiplexer causing samples of the second sensor signal corresponding to subsequent phases of the second spinning current scheme to be intermitted by samples of the at least one third sensor signal.

2. The sensor circuit of claim 1, wherein the multiplexer is configured to time division multiplex the second and the at least one third sensor signal.

3. The sensor circuit of claim 1, further comprising a delay circuit configured to cause a sampling delay between a sampling interval of the first analog-to-digital converter and a sampling interval of the second analog-to-digital converter.

4. The sensor circuit of claim 3, further comprising:
a first digital filter configured to filter the sampled first sensor signal, wherein the first digital filter has a first filter delay;
a second digital filter configured to filter samples of the sampled multiplexed sensor signal associated with the second sensor signal, wherein the second digital filter has a second filter delay; and
wherein a difference between the first filter delay and the second filter delay corresponds to the sampling delay.

5. The sensor circuit of claim 4, wherein the first and the second digital filters are respective digital moving average filters.

6. The sensor circuit of claim 4, further comprising:
a demultiplexer coupled upstream to the second digital filter, and configured to separate samples of the second sensor signal from samples of the at least one third sensor signal comprised of the sampled multiplexed sensor signal.

7. The sensor circuit of claim 4, wherein the second digital filter is configured to filter out the sampled multiplexed sensor signal by weighting samples of the at least one third sensor signal with zero.

8. The sensor circuit of claim 4, wherein a sum of the second filter delay and the sampling delay corresponds to the first filter delay.

9. The sensor circuit of claim 4, wherein the sampling delay corresponds to a fraction of a multiplexing time slot.

10. The sensor circuit of claim 9, wherein the sampling delay corresponds to half a multiplexing time slot.

11. The sensor circuit of claim 1, wherein the first physical quantity is a magnetic field and the second physical quantity is different from the magnetic field.

12. The sensor circuit of claim 1, wherein the first sensor signal is a sensor signal from a first magnetic field sensor and the second sensor signal is a sensor signal from a second magnetic field sensor.

13. The sensor circuit of claim 1, wherein the third sensor signal is a sensor signal from a stress or temperature sensor.

14. The sensor circuit of claim 1, wherein a frequency of subsequent phases of the first spinning current scheme is twice a frequency of subsequent phases of the second spinning current scheme.

15. The sensor circuit of claim 1, further comprising:
a delay circuit configured to delay a sampling interval of the second analog-to-digital converter vis-à-vis a sampling interval of the first analog-to-digital converter by a sampling delay corresponding to half a sampling interval.

16. The sensor circuit of claim 15, further comprising:
a first digital moving average filter configured to filter the sampled first sensor signal, and having a first filter delay and a first filter length covering a plurality of cycles of the first spinning current scheme; and
a second digital moving average filter configured to filter samples of sampled multiplexed sensor signal associated with the second sensor signal, and having a second filter delay and a second filter length covering at least one cycle of the second spinning current scheme,
wherein a sum of the second filter delay and the sampling delay corresponds to the first filter delay.

17. The sensor circuit of claim 1, further comprising:
a control circuit configured to compare one or more samples derived from the first sensor signal against one or more samples derived from the second sensor signal and to perform a functional safety measure in case a deviation of the compared samples exceeds a predefined threshold.

18. A sensing method, comprising:
providing a first sensor signal, from a first Hall sensor operative according to a first spinning current scheme, in response to a first measurement of a first physical quantity;
providing a second sensor signal, from a second Hall sensor operative according to a second spinning current scheme, in response to a second measurement of the same first physical quantity;
providing at least one third sensor signal in response to at least one third measurement of at least one second physical quantity that is different from the first physical quantity;
multiplexing the second and the at least one third sensor signal to generate a multiplexed sensor signal;
sampling the first sensor signal with a first analog-to-digital converter to generate a digital first sensor signal;
filtering the digital first sensor signal with a first digital filter, wherein the filtering the digital first sensor signal comprises averaging a first number of phases of the first spinning current scheme;
sampling the multiplexed sensor signal with a second analog-to-digital converter to generate a digital multiplexed sensor signal;
causing a sampling delay between a sampling interval of the first analog-to-digital converter and a sampling interval of the second analog-to-digital converter; and
filtering samples of the digital multiplexed sensor signal associated with the second sensor signal with a second digital filter, wherein the filtering the samples of the digital multiplexed sensor signal comprises averaging a different second number of phases of the second spinning current scheme, wherein a difference between a first filter delay of the first digital filter and a second filter delay of the second digital filter corresponds to the sampling delay.

19. The sensing method of claim 18, wherein the sampling delay corresponds to half a multiplexing time slot.

20. The sensing method of claim 18, wherein a sum of the second filter delay and the sampling delay corresponds to the first filter delay.

21. The sensing method of claim 18, wherein filtering the samples of the digital multiplexed sensor signal comprises disregarding samples of the at least one third sensor signal.

* * * * *